(12) United States Patent
Sun

(10) Patent No.: US 11,737,378 B2
(45) Date of Patent: Aug. 22, 2023

(54) GRAPHENE/DOPED 2D LAYERED MATERIAL VAN DER WAALS HETEROJUNCTION SUPERCONDUCTING COMPOSITE STRUCTURE, SUPERCONDUCTING DEVICE, AND MANUFACTURING METHOD THEREFOR

(71) Applicant: Xuyang Sun, Jiaxing (CN)

(72) Inventor: Xuyang Sun, Jiaxing (CN)

( * ) Notice: Subject to any disclaimer, the term of this patent is extended or adjusted under 35 U.S.C. 154(b) by 49 days.

(21) Appl. No.: 17/634,871

(22) PCT Filed: Aug. 11, 2020

(86) PCT No.: PCT/CN2020/108471
§ 371 (c)(1),
(2) Date: Feb. 11, 2022

(87) PCT Pub. No.: WO2021/027816
PCT Pub. Date: Feb. 18, 2021

(65) Prior Publication Data
US 2022/0278265 A1    Sep. 1, 2022

(30) Foreign Application Priority Data
Aug. 14, 2019  (CN) .......................... 201910751219.8

(51) Int. Cl.
*H10N 60/85*   (2023.01)
*H10N 60/12*   (2023.01)
*H10N 60/01*   (2023.01)

(52) U.S. Cl.
CPC ......... *H10N 60/85* (2023.02); *H10N 60/0241* (2023.02); *H10N 60/12* (2023.02)

(58) Field of Classification Search
CPC .... H10N 60/85; H10N 60/0241; H10N 60/12; H10N 60/01; H10N 60/10; H10N 60/128; H10N 60/80
See application file for complete search history.

(56) References Cited

U.S. PATENT DOCUMENTS

| 2015/0080223 A1 | 3/2015 | Miyazaki et al. |
| 2016/0016796 A1 | 1/2016 | Hersam et al. |

(Continued)

FOREIGN PATENT DOCUMENTS

| CN | 102184942 A | 9/2011 |
| CN | 105070347 A | 11/2015 |

(Continued)

OTHER PUBLICATIONS

Cao et al. ("2-D Layered Materials for Next-Generation Electronics: Opportunities and Challenges," IEEE Transactions on Electron Devices, vol. 65, No. 10, Oct. 2018) (Year: 2018).*

(Continued)

*Primary Examiner* — Yasser A Abdelaziez
(74) *Attorney, Agent, or Firm* — Clark & Elbing LLP

(57) ABSTRACT

A graphene/doped 2D layered material Van der Waals heterojunction superconducting composite structure, a superconducting device and a manufacturing method therefor, which relate to the technical field of superconducting materials. Said structure includes: a (2n+1)-layered structure formed by graphene layers and doped 2D layered materials which are alternately provided. An outer layer of the layered structure is the graphene layer, n is an integer between 1 to 50, a superconducting region is formed by a region in which the graphene perpendicularly overlaps the doped 2D layered material, and the graphene layers and the doped two-dimensional layered materials are self-assembled into one piece by means of a Van der Waals force.

16 Claims, 1 Drawing Sheet

(56) References Cited

U.S. PATENT DOCUMENTS

| 2016/0284811 A1 | 9/2016 | Yu et al. |
| 2017/0194144 A1 | 7/2017 | Duan et al. |
| 2018/0102197 A1 | 4/2018 | Adams |

FOREIGN PATENT DOCUMENTS

| CN | 105372853 A | 3/2016 |
| CN | 105702775 A | 6/2016 |
| CN | 106024861 A | 10/2016 |
| CN | 106205861 A | 12/2016 |
| CN | 106898433 A | 6/2017 |
| CN | 107419153 A | 12/2017 |
| CN | 107425081 A | 12/2017 |
| CN | 107481871 A | 12/2017 |
| CN | 107634089 A | 1/2018 |
| CN | 108064420 A | 5/2018 |
| CN | 108862252 A | 11/2018 |
| CN | 108899413 A | 11/2018 |
| CN | 109019569 A | 12/2018 |
| CN | 110429174 A | 11/2019 |
| EP | 0430798 B1 | 4/1997 |
| JP | 2015-60908 A | 3/2015 |
| WO | WO-2014/146017 A1 | 9/2014 |
| WO | WO-2018/185306 A1 | 10/2018 |

OTHER PUBLICATIONS

Novoselov et al. ("2D materials and van der Waals heterostructures," Science, vol. 353, Issue 6298, Jul. 29, 2016) (Year: 2016).*

Zhang et al. ("Direct growth of large-area graphene and boron nitride heterostructures by a co-segregation method," Nature Communications, Mar. 4, 2015) (Year: 2015).*

Wu et al. ("In situ synthesis of a large area boron nitride/graphene monolayer/boron nitride film by chemical vapor deposition," Nanoscale, 7, pp. 7574-7579, 2015) (Year: 2015).*

International Search Report for International Application No. PCT/CN2020/108471, dated Oct. 28, 2020 (8 pages).

First Office Action for Chinese Application No. 201910751219.8, dated Apr. 12, 2021 (13 pages).

Notification to Grant Patent Right for Invention for Chinese Application No. 201910751219.8, dated Oct. 13, 2021 (8 pages).

Written Opinion for International Application No. PCT/CN2020/108471, dated Oct. 28, 2020 (5 pages).

* cited by examiner

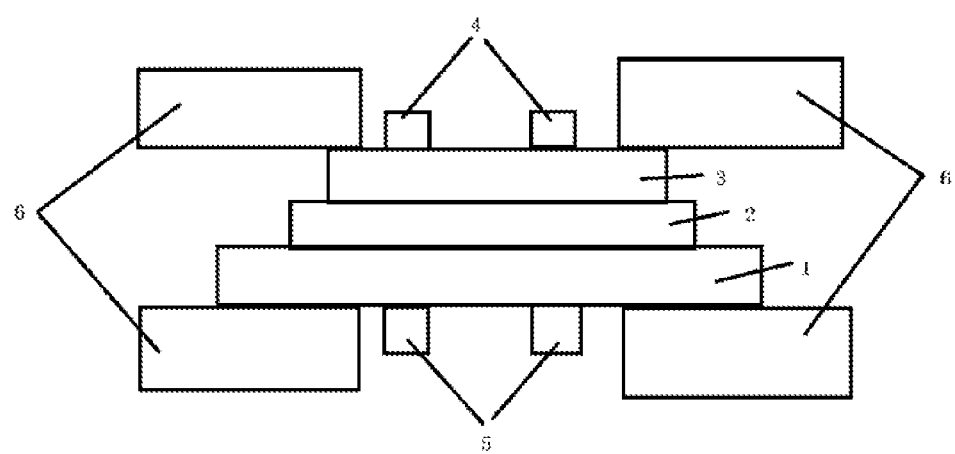

GRAPHENE/DOPED 2D LAYERED MATERIAL VAN DER WAALS HETEROJUNCTION SUPERCONDUCTING COMPOSITE STRUCTURE, SUPERCONDUCTING DEVICE, AND MANUFACTURING METHOD THEREFOR

TECHNICAL FIELD

The present disclosure relates to the technical field of superconducting materials, and in particular to a graphene/doped 2D layered material van der Waals heterojunction superconducting composite structure, a superconducting device and a preparation method thereof (a manufacturing method therefor).

BACKGROUND ART

Superconductivity refers to the property that the resistance of certain substances drops to zero under certain temperature conditions (generally low temperatures). In 1911, the Dutch physicist H. Kamolin Onnes first discovered that mercury enters a superconducting state at around 4.2K. In 1933, Meissner and Olsenfeld from Netherland jointly discovered that when the material is in a superconducting state, the magnetic induction intensity in the superconductor is zero, and it has diamagnetism, i.e., the so-called "Meissner effect". From 1986 to 1993, copper-oxygen-based materials increased the record of critical superconducting temperature to 138K, and a huge breakthrough was made in high-temperature superconductors. However, the above-mentioned high-temperature superconductors are of a multi-compound crystal structure. It is very difficult to accurately control the preparation, the manufacturing cost is high and the machinability of the material is poor. In addition, the mechanism of copper-oxygen-based-material high-temperature superconductors is complex, and theoretical research has failed to reach a consensus.

Graphene is a 2D (2-dimensional) crystal with honeycomb lattices formed by $sp^2$-hybridization of carbon atoms. It has some unique properties. Firstly, the specific surface area of graphene is very large, up to 2630 $m^2/g$. Secondly, since the carbon atoms in graphene are hybridized in $sp^2$ mode and each carbon atom and its adjacent three carbon atoms form stable carbon-carbon bonds through $\sigma$ bonds, graphene has extremely high mechanical properties. Its Young's modulus can reach 1100 GPa, and its tensile strength exceeds 100 GPa. Thirdly, graphene has excellent electrical conductivity, and its carrier migration rate can be as high as $2 \times 10^5$ $cm^2 \cdot V^{-1} \cdot S^{-1}$, while its resistivity is only $10^{-8}$ $\Omega m$. In particular, the effective mass of the carriers near the overlap between valence band maximum and conduction band minimum of graphene is 0, and the rate of the carriers is about 1/300 of the rate of photons. Therefore, electrons and holes are equivalent to massless electrons in a free space described by the Dirac equation. The carrier motion of graphene is hardly affected by phonon collisions, and that is the so-called lossless ballistic transmission, which is a property only for Dirac fermions. All because the particles can completely tunnel through graphene, the holes and electrons in graphene have a very long free path. Therefore, graphene has huge potential application value and is one of the most important new materials today.

However, because the carrier concentration of ordinary graphene is too low (the carrier concentration is 0 at the Dirac point), the ordinary graphene cannot directly become a superconductor. The current methods for inducing graphene to have superconductivity are as follows: rotation: for example, double-layer graphene rotates at an angle of 1.1°, and the superconducting transition temperature is 1.7K; intercalation: for example, Ca is intercalated in double-layer graphene, i.e., $C_6CaC_6$, and the superconducting transition temperature is 4K; doping: for example, K is doped in few-layer graphene, and the superconducting transition temperature is 4.5K; and heterojunction: for example, Li is deposited on the surface of graphene at a low temperature, and it is observed that the electro-acoustic coupling coefficient is 0.58, the paired band gap is 0.9 meV, and the superconducting transition temperature is 5.9K. However, because the band gap that can be opened by the above method is too small, the Fermi level shift is too small, the obtainable superconducting transition temperature is relatively low, and the intercalation, doping or other method destroys the ideal crystal structure of graphene, so that the carriers obtain a larger non-zero effective mass, and no longer have the Dirac fermion property of lossless ballistic transmission.

Meanwhile, 2D material can easily self-assemble through a van der Waals force to form an ultra-thin van der Waals heterojunction. The existing van der Waals heterojunction is mainly used in the semiconductor field, such as transistors, rectifiers, memories, or the like; when the van der Waals heterojunction is applied to superconducting materials, they can only work at extremely low temperatures; for example, the above-mentioned Li/graphene superconducting transition temperature is only 5.9K.

Therefore, it is desired a composite structure based on a 2D material that can have the properties of high-temperature superconductivity and has a higher critical magnetic field.

For this reason, the present disclosure is provided.

SUMMARY

One of the objectives of the present disclosure is to provide a graphene/doped 2D layered material van der Waals heterojunction superconducting composite structure, which has the properties of high-temperature superconductivity and a higher critical magnetic field.

Another objective of the present disclosure is to provide a superconducting device including the above-mentioned graphene/doped 2D layered material van der Waals heterojunction superconducting composite structure.

A yet another objective of the present disclosure is to provide a preparation method of a superconducting device.

In order to achieve the above objectives, the present disclosure adopts the following technical solutions.

In a first aspect, provided is a graphene/doped 2D layered material van der Waals heterojunction superconducting composite structure, including: a (2n+1)-layered structure formed by graphene layers and doped 2D layered materials which are alternately provided, wherein an outer layer of the layered structure is a graphene layer, wherein n is an integer between 1 and 50, a region in which the graphene and the doped 2D layered material completely perpendicularly overlap forms a superconducting region, and the graphene layers and the doped 2D layered materials are self-assembled into a whole by a van der Waals force.

In a second aspect, provided is a superconducting device, including the above-mentioned graphene/doped 2D layered material van der Waals heterojunction superconducting composite structure and metal electrodes.

In a third aspect, provided is a preparation method of a superconducting device, including the following steps:

with the aid of supporting and pressing blocks, first placing a first graphene layer, transferring a doped 2D layered material on the first graphene layer, and then transferring a second graphene layer on the doped 2D layered material, and compacting by using two pairs of spaced supporting and pressing blocks; arranging two pairs of upper and lower metal electrodes on the first and second graphene layers, respectively, aligning the upper and lower metal electrodes, and then welding tabs thereon to form positive and negative electrodes, thus obtaining a superconducting device.

The present disclosure has the following beneficial effects.

The outer sides of the core structure of the graphene/doped 2D layered material van der Waals heterojunction superconducting composite structure of the present disclosure are configured as graphene layers. Graphene functions as a conductive layer, and carriers are close to lossless transmission in graphene. The inner interlayer is configured as a doped 2D layered material, which provides a high carrier (electron or hole) concentration to form a "carrier pool". The electrons flow into the outer graphene layer, which greatly increases the carrier concentration in the conductive layer of graphene; the carriers in the outer graphene layer generate strong electro-acoustic coupling; at the same time, the induced current of the outer graphene layer can shield the external magnetic field and form the Meissner effect. The mutual attraction of the currents in the same direction also causes the superconducting material to be in a further compressed state in the working state, thus achieving a good contact between layers of the structure and good rigidity and improving the mechanical properties of the structure. Then, the graphene and the doped 2D layered material are alternately placed in sequence, and the above characteristics can still be maintained.

Therefore, the graphene/doped 2D layered material heterojunction superconducting material of the present disclosure has a good performance, a high critical temperature, a high critical magnetic field, low material cost, good mechanical properties and a good machinability. In addition, the heterojunction superconductor has a simpler structure than other high-temperature superconductors (such as copper-oxygen-based high-temperature superconductors), so it is simpler to conduct research on the electro-acoustic interaction, electron/hole transport and phase transition of the heterojunction superconductor in theory, and it is more able to understand the laws through theoretical research, so as to better control and optimize the properties of the material.

BRIEF DESCRIPTION OF DRAWINGS

In order to more clearly illustrate the technical solutions in the specific embodiments of the present disclosure or in the prior art, drawings required to be used for description of specific embodiments or the prior art will be introduced briefly hereinafter. Obviously, the drawings used in the following description are merely some embodiments of the present disclosure. For those ordinarily skilled in the art, other drawings may also be obtained according to these drawings without any creative work.

FIG. 1 is a schematic structural diagram of a superconducting device prepared in Example 1 of the present disclosure.

Reference signs: 1—lower graphene layer; 2—single-layer hexagonal boron nitride; 3—upper graphene layer; 4—upper metal electrode; 5—lower metal electrode; 6—supporting and pressing block.

DETAILED DESCRIPTION OF EMBODIMENTS

The technical solutions of the present disclosure will be described clearly and completely below in conjunction with the examples, and it will be apparent that the embodiments described herein are merely a part of, not all the embodiments of the present disclosure. All other embodiments obtained by a person of ordinary skill in the art based on the embodiments of the present disclosure without creative efforts shall fall within the protection scope of the present disclosure.

According to the first aspect of the present disclosure, provided is a graphene/doped 2D layered material van der Waals heterojunction superconducting composite structure, including: a (2n+1)-layered structure formed by graphene layers and doped 2D layered materials which are alternately provided, an outer layer of the layered structure being a graphene layer, wherein n is an integer between 1 and 50, a region in which the graphene and the doped 2D layered material completely perpendicularly overlap forms a superconducting region, and the graphene layers and the doped 2D layered materials are self-assembled into a whole by a van der Waals force.

Current superconducting materials generally work at low temperatures, and it is expected to obtain a simple high-temperature superconducting structure.

The composition of the superconducting material according to the present disclosure includes:

graphene and a doped 2D layered material. The graphene and a doped 2D layered material are stacked in the form of a van der Waals heterojunction. The graphene and the doped 2D layered material are alternately stacked, and uppermost and lowermost layers are both graphene.

Thin film materials are self-assembled (stacked) by a van der Waals force to form a van der Waals heterojunction.

The graphene and the doped 2D layered material are alternately arranged to form 2n+1 layers, wherein n is typically, but not limited to, for example, 1, 2, 3, 4, 5, 6, 7, 8, 9, 10, 20, 22, 25, 28, 30, 32, 35, 36, 38, 40, 42, 45, 46, 48, or 50.

Several typical situations are as follows.

When n=1, the graphene/doped 2D layered material van der Waals heterojunction superconducting composite structure is of a "sandwich" structure: upper and lower layers are both graphene, and the doped 2D layered material is in the middle. In other words, the graphene/doped 2D layered material van der Waals heterojunction superconducting composite structure sequentially includes a first graphene layer (lower graphene layer), a doped 2D layered material, and a second graphene layer (upper graphene layer).

Preferably, an area of the first graphene layer is greater than an area of the doped 2D layered material, and the area of the doped 2D layered material is greater than or equal to an area of the second graphene layer. For example, in an embodiment, the length and width of the first graphene layer are each independently between 160 μm and 250 μm (for example, the length and width are both 200 μm), and the length and width of the doped 2D layered material are each independently between 70 μm and 150 μm (for example, length and width are both 100 μm), and the length and width of the second graphene layer are each independently between 70 μm and 100 μm (for example, the length and width are both 90 μm).

When n=2, the graphene/doped 2D layered material van der Waals heterojunction superconducting composite structure sequentially includes a graphene layer, a doped 2D layered material, a graphene layer, a doped 2D layered material, and a graphene layer.

When n=3, the graphene/doped 2D layered material van der Waals heterojunction superconducting composite structure sequentially includes a graphene layer, a doped 2D layered material, a graphene layer, a doped 2D layered material, a graphene layer, a doped 2D layered material, and a graphene layer; and so on.

The number of layers of graphene (graphene layers) is not limited. A single layer of graphene or a few layers of graphene may be provided, such as 2 layers of graphene, 3 layers of graphene, 4 layers of graphene, 5 layers of graphene, 6 layers of graphene, 7 layers of graphene, 8 layers of graphene, 9 layers of graphene, or 10 layers of graphene.

The number of layers of doped 2D layered material is not limited. A single layer of doped 2D layered semiconductor material or a few layers (such as 2 layers, 3 layers, 4 layers, 5 layers, 6 layers, 7 layers, 8 layers, 9 layers, or 10 layers) of doped 2D layered semiconductor material may be provided, and a single layer of doped 2D layered insulator material or a few layers (such as 2 layers, 3 layers, 4 layers, 5 layers, 6 layers, 7 layers, 8 layers, 9 layers, or 10 layers) of doped 2D layered insulator material may be provided.

The 2D layered material refers to 2D layered materials other than graphene. The type of the 2D layered material is not limited, including but not limited to hexagonal boron nitride (h-BN), transition metal dichalcogenide (TMD), silylene, phosphorene or boron alkene; preferably the 2D layered material is hexagonal boron nitride (h-BN), molybdenum disulfide ($MoS_2$) or phosphorene.

The element doped in the 2D layered material is not limited. The type and method of doping for the 2D layered material are also not limited. The type of doping is typically, for example, n-type doping or p-type doping, and the doping is typically carried out by, for example, high-temperature diffusion or ion implantation.

Typical examples are h-BN doped p-type and $MoS_2$ doped n-type.

The doping for the 2D layered materials can refer to the following basis.

1. Compared with pure graphene, the heterojunction energy band structure has a Fermi level shifted under the Dirac point of graphene, and this Fermi level is located near the conduction band minimum in a band gap of the 2D layered semiconductor/insulator material, so that n-type doping is performed when the 2D layered semiconductor/insulator material shows the characteristics of an n-type semiconductor.

2. Compared with pure graphene, the heterojunction energy band structure has a Fermi level shifted above the Dirac point of graphene, and this Fermi level is located near the valence band maximum in the band gap of the 2D layered semiconductor/insulator material, so that p-type doping is performed when the 2D layered semiconductor/insulator material shows the characteristics of a p-type semiconductor.

3. Compared with pure graphene, the heterojunction energy band structure has a Fermi level shifted above the Dirac point of graphene, and this Fermi level is located near the valence band maximum in a band gap of the 2D layered semiconductor/insulator material, so that n-type heavy doping is performed when the 2D layered semiconductor/insulator material shows the characteristics of a p-type semiconductor.

4. Compared with pure graphene, the heterojunction energy band structure has a Fermi level shifted under the Dirac point of graphene, and this Fermi level is located near the conduction band minimum in the band gap of the 2D layered semiconductor/insulator material, so that p-type heavy doping is performed when the 2D layered semiconductor/insulator material shows the characteristics of an n-type semiconductor.

It should be noted that in a combination process, the number of layers of graphene, the number of layers of 2D layered material, and the concentration and type of doping can be freely combined.

Generally, although graphene doping or intercalation opens the band gap and provides carriers, the doping or intercalation destroys the lossless ballistic transmission property of the 0-mass Dirac fermions of the carries in graphene, so that the carriers obtain a larger non-zero effective mass, and the free path of electrons is rapidly reduced: the performance of graphene is reduced, and the superconducting transition temperature is quite low.

According to the present disclosure, (1) since graphene is not doped or intercalated, the structure of graphene is not destroyed and the carriers still have the Dirac fermion property of lossless ballistic transmission. (2) The heterojunction causes the Fermi level to shift and provides a certain carrier concentration. (3) The doping for the 2D layered material further greatly increases the carrier concentration. This is because, unlike a general semiconductor that generate a space charge region to form an internal electric field to prevent further diffusion movement, a single layer or few layers of 2D layered material have no space charge region shielding and cannot form an internal electric field to prevent the diffusion movement, so that all the excess free electrons due to doping diffuse into the graphene layer and thus the outer graphene layer is extremely rich in carriers. (4) According to the traditional BCS theory, based on Tc=$0.85\Theta_D\exp(-1/N(0)V)$, where $\Theta_D$ represents Debye temperature, N(0) represents energy state density at a Fermi level, and V represents electro-acoustic coupling coefficient. Due to the short bond length of graphene crystals, the elastic modulus is large and the Debye temperature $\Theta_D$ is high. Further, the uppermost and lowermost graphene layers can form electro-acoustic coupling through vertical phonon emission to break through the "McMillan limit". (5) The outer graphene layer of the structure provides protection for the middle layer or the inner layer, preventing the penetration of magnetic force lines from causing loss of eddy current and destroying superconductivity.

Therefore, the structure material of the present disclosure can achieve high-temperature superconductivity and belongs to a second type of superconductor. The structure material of the present disclosure has the following advantages: 1. high critical temperature Tc; 2. high critical magnetic field Hc or $Hc_2$; 3. high critical current density Jc under a strong magnetic field; 4. low material cost; and 5. good mechanical properties and machinability.

The graphene layers and the doped 2D layered materials are self-assembled layer by layer under the action of van der Waals force, and the preparation of the material has good controllability and low cost.

Preferably, the van der Waals force self-assembly includes mechanical stacking or chemical deposition.

According to the second aspect of the present disclosure, provided is a superconducting device, including the above-mentioned graphene/doped 2D layered material van der Waals heterojunction superconducting composite structure and metal electrodes.

The superconducting device and the graphene/doped 2D layered material van der Waals heterojunction superconducting composite structure of the present disclosure are provided based on the same inventive concept, and therefore, can achieve the same effect.

Preferably, materials of the metal electrodes are independently one of chromium, gold, silver, copper, nickel, palladium, platinum, or iridium metal or alloy.

By arranging the metal electrodes, the desired device can be made.

According to the third aspect of the present disclosure, provided is a preparation method of the above superconducting device of, for example, a "sandwich" structure in which upper and lower layers are both graphene and a doped 2D layered material is in the middle, including the following steps:

with an aid of supporting and pressing blocks, first placing a first graphene layer, transferring a doped 2D layered material on the first graphene layer, and then transferring a second graphene layer on the doped 2D layered material, and pressing all the layers by using two pairs of spaced supporting and pressing blocks; arranging two pairs of upper and lower metal electrodes on the first and second graphene layers, respectively, aligning the upper and lower metal electrodes, and then welding tabs thereon to form positive and negative electrodes, thus obtaining a superconducting device.

The typical preparation method of the superconducting device of a "sandwich" structure is simple and feasible, and is suitable for industrial production.

Here, the method for preparing the metal electrodes is not limited. For example, it can be, but is not limited to, metal deposition or standard electron beam exposure method.

Preferably, the supporting and pressing block is configured as a silicon wafer with a $SiO_2$ passivation film on its surface.

The present disclosure will be further illustrated below by examples. Unless otherwise specified, the materials in the examples are prepared according to existing methods or directly purchased from the market.

Example 1

Single-layer graphene/p-doped single-layer hexagonal boron nitride (h-BN)/single-layer graphene van der Waals heterojunction structure: the uppermost layer and the lowermost layer were both single-layer graphene, the middle layer was p-doped single-layer hexagonal boron nitride (h-BN), and all the layers were stacked to form a "sandwich" structure in the form of a van der Waals heterojunction.

Here, the graphene was purchased from Nanjing XFNANO Material Technologies Co., Ltd. The p-doped single-layer hexagonal boron nitride was prepared by repeatedly pasting the corresponding bulk material by using a transparent tape and peeling off, and p-doping was carried out by high-temperature diffusion method (the doping concentration was $1\text{-}10^{-4}$, at %). As shown in FIG. 1, with the aid of an optical microscope, the above-mentioned materials are stacked layer by layer. The length and width of the lowermost graphene layer 1 are both 200 μm, the length and width of the middle single-layer hexagonal boron nitride 2 are about 100 μm, and the length and width of the uppermost graphene layer 3 are both 90 μm.

In use, metal electrodes were pre-deposited on two ends of each of the upper and lower graphene sheets (left end and right end). The upper metal electrodes 4 on the upper graphene layer 3 were relatively centered, each with a width of 5 μm and a length of 60 μm and having a spacing of 40 μm therebetween. The lower metal electrodes 5 on the lower graphene layer were relatively centered, each with a width of 5 μm and a length of 200 μm, and having a spacing of 40 μm therebetween. The metal deposition was carried out in a sequence of 10 nm chromium and 60 nm gold in thickness. The lowermost graphene layer was suspended on two supporting and pressing blocks 6 having a spacing of 80 μm therebetween. The supporting and pressing blocks were configured as passivated silicon wafers each having a 200 nm $SiO_2$ surface layer, with the lower metal electrodes 5 at the bottom. With the aid of an optical microscope, single-layer hexagonal boron nitride 2 was first stacked on the lowermost graphene layer 1, and then the uppermost graphene layer 3 was stacked on the single-layer hexagonal boron nitride, with the upper metal electrodes 4 at the top; and then, they were pressed by two supporting and pressing blocks 6 having a spacing of 80 μm therebetween. The stacking should meet the following requirements: the uppermost graphene layer, the hexagonal boron nitride nanosheet and the lowermost graphene layer have a completely vertical overlap region, and the upper and lower metal electrodes are basically aligned. Then, the upper metal electrodes 4 on the left and right ends of the upper graphene sheet respectively extended to the edge of the lowermost graphene layer through metal deposition. The upper metal electrodes 4 finally had a length of 200 μm and were opposite to the lower metal electrodes 5, and tabs were then welded to form two electrodes on the left and right; finally a superconducting device with "single-layer graphene/p-doped single-layer hexagonal boron nitride (h-BN)/single-layer graphene" van der Waals heterojunction structure was obtained.

The superconducting device was cooled in a 40K-80K liquid helium/liquid nitrogen environment and then energized to test the superconductivity. When the doping concentration was $10^{-4}$, at %, the superconducting transition temperature of the above-mentioned superconducting structure device was 50K. After the conditions were optimized, the superconducting transition temperature of the above-mentioned superconducting structure device can be greater than 100K.

Example 2

This example differs from Example 1 in that the uppermost layer and the lowermost layer are both single-layer graphene, the middle layer is n-doped few-layer molybdenum disulfide ($MoS_2$), and all the layers are self-assembled to form a "sandwich" structure in the form of a van der Waals heterojunction.

The few-layer molybdenum disulfide was obtained by vapor deposition on the graphene substrate based on the decomposition of ammonium tetrathiomolybdate. The decomposition of ammonium tetrathiomolybdate was based on the following two reaction formulas:

$$(NH_4)_2MoS_4 + H_2 \rightarrow 2NH_3 + H_2S + MoS_3; \qquad (1)$$

$$MoS_3 \rightarrow MoS_2 + S. \qquad (2)$$

Here, the reaction temperature of formula (1) was 500° C.; the reaction temperature of formula (2) was about 950° C.

The suspended graphene (the electrode was disposed at its bottom) that was pressed by two pairs of supporting and pressing blocks and had deposited metal electrodes was placed in a tube furnace, and measures were taken to seal the bottom so that the graphene on the back side was not deposited by new gas. In a hydrogen/argon atmosphere, the heated and evaporated ammonium tetrathiomolybdate gas was introduced, the temperature was increased step by step to 1000° C. and then held to obtain a few-layer (5-10 layers) molybdenum disulfide deposited on the graphene. The coated reaction raw material was still n-doped in the tube furnace by high-temperature diffusion method (wherein the doping concentration was $1\text{-}10^{-4}$, at %), and then taken out. One pair of upper supporting and pressing blocks were removed and the graphene on which the metal electrodes had been deposited (with the electrodes on the top) was stacked on the molybdenum disulfide thin layer, and the above structure was then pressed by a pair of supporting and pressing blocks.

The resultant was cooled in a 40K-80K liquid helium/liquid nitrogen environment and then energized to test the superconductivity. When the doping concentration was $10^{-4}$, at %, the superconducting transition temperature of the above-mentioned superconducting structure device was 36K. After the conditions were optimized, the superconducting transition temperature of the above-mentioned superconducting structure device can be greater than 80K.

Example 3

This example differs from Example 1 in that the uppermost layer and the lowermost layer are both single-layer graphene, the middle layer is p-doped single-layer phosphorene, and all the layers are stacked to form a "sandwich" structure in the form of a van der Waals heterojunction.

Here, the p-doped single-layer phosphorene was prepared by repeatedly pasting the corresponding bulk material by using a transparent tape and peeling off and p-doping was carried out by ion implantation method (wherein the doping concentration was $1\text{-}10^{-4}$, at %).

Example 4

This example differs from Example 1 in that the uppermost layer and the lowermost layer are both double-layer graphene, the middle layer is p-doped single-layer hexagonal boron nitride (h-BN), and all the layers are stacked to form a "sandwich" structure in the form of a van der Waals heterojunction.

Example 5

This example differs from Example 1 in that the uppermost layer and the lowermost layer are both single-layer graphene, the middle layer is n-doped three-layer hexagonal boron nitride (h-BN), and all the layers are stacked to form a "sandwich" structure in the form of a van der Waals heterojunction.

Here, the n-doped three-layer hexagonal boron nitride was prepared by repeatedly pasting the corresponding bulk material by using a transparent tape and peeling off and n-doping was carried out by ion implantation method (wherein the doping concentration was $1\text{-}10^{-4}$, at %).

Example 6

This example differs from Example 1 in that the uppermost layer and the lowermost layer are both ten-layer graphene, the middle layer is p-doped double-layer hexagonal boron nitride (h-BN), and all the layers are stacked to form a "sandwich" structure in the form of a van der Waals heterojunction.

Here, the p-doped double-layer hexagonal boron nitride was prepared by repeatedly pasting the corresponding bulk material by using a transparent tape and peeling off and p-doping was carried out by high-temperature diffusion method (wherein the doping concentration was $1\text{-}10^{-4}$, at %).

Example 7

This example differs from Example 1 in that the uppermost layer and the lowermost layer are both single-layer graphene, the middle layer is n-doped three-layer molybdenum disulfide ($MoS_2$), and all the layers are stacked to form a "sandwich" structure in the form of a van der Waals heterojunction.

Here, the n-doped three-layer molybdenum disulfide was prepared by repeatedly pasting the corresponding bulk material by using a transparent tape and peeling off and n-doping was carried out by ion implantation method (wherein the doping concentration was $1\text{-}10^{-4}$, at %).

Example 8

This example differs from Example 1 in that that the p-doped single-layer hexagonal boron nitride is replaced with n-heavily-doped single-layer hexagonal boron nitride.

Example 9

A heterojunction superconducting structure sequentially included a graphene layer, a p-doped single-layer hexagonal boron nitride, a graphene layer, a p-doped single-layer hexagonal boron nitride, and a graphene layer.

Except for the addition of stacked materials, the preparation method of this example is the same as that of Example 1.

Example 10

A heterojunction superconducting structure sequentially included single-layer graphene, p-doped single-layer hexagonal boron nitride (h-BN), single-layer graphene, p-doped single-layer hexagonal boron nitride (h-BN), and single-layer graphene.

Example 11

A heterojunction superconducting structure sequentially included single-layer graphene, p-doped single-layer hexagonal boron nitride (h-BN), single-layer graphene, p-heavily-doped single-layer molybdenum disulfide, and single-layer graphene.

Examples 3 to 11 were also tested for superconductivity in the same manner as Example 1. Examples 3 to 11 can also obtain a higher superconducting transition temperature similar to that of Example 1 and thus have great application prospects.

Finally, it should be noted that the above embodiments are only used for illustrating rather than limiting the technical solutions of the present disclosure. Although the present disclosure is described in detail with reference to the foregoing embodiments, those of ordinary skill in the art should understand that they still can make modifications to the technical solutions disclosed in the foregoing embodiments or make equivalent substitutions to part or all of technical features thereof; and such modifications or substitutions should not cause the essence of the corresponding technical solutions to depart from the scope of the technical solutions of the embodiments of the present disclosure.

The invention claimed is:

1. A graphene/doped 2D layered material van der Waals heterojunction superconducting composite structure, comprising: a (2n+1)-layered structure formed by graphene layers and doped 2D layered materials which are alternately provided, wherein an outer layer of the layered structure is a graphene layer, wherein n is an integer between 1 and 50, wherein a region in which graphene and doped 2D layered material completely perpendicularly overlap forms a superconducting region, and the graphene layers and the doped 2D layered materials are self-assembled into a whole by a van der Waals force.

2. The graphene/doped 2D layered material van der Waals heterojunction superconducting composite structure according to claim 1, wherein n is an integer between 1 and 5.

3. The graphene/doped 2D layered material van der Waals heterojunction superconducting composite structure according to claim 1, wherein each of the graphene layers comprises a single layer of graphene or 2 to 10 layers of graphene.

4. The graphene/doped 2D layered material van der Waals heterojunction superconducting composite structure according to claim 1, wherein a 2D layered material in the doped 2D layered material comprises a 2D layered semiconductor material or a 2D layered insulator material.

5. The graphene/doped 2D layered material van der Waals heterojunction superconducting composite structure according to claim 1, wherein doping for the doped 2D layered material comprises n-type doping or p-type doping.

6. The graphene/doped 2D layered material van der Waals heterojunction superconducting composite structure according to claim 1, wherein a self-assembly by van der Waals force comprises mechanical stacking or chemical deposition.

7. A superconducting device, comprising the graphene/doped 2D layered material van der Waals heterojunction superconducting composite structure according to claim 1 and metal electrodes.

8. A preparation method for the superconducting device according to claim 7, comprising a following step:
   first placing, with an aid of supporting and pressing blocks, a first graphene layer, transferring a doped 2D layered material on the first graphene layer, and then transferring a second graphene layer on the doped 2D layered material, and pressing all layers by using two pairs of spaced supporting and pressing blocks; and arranging two pairs of upper and lower metal electrodes on the first graphene layer and the second graphene layer, respectively, aligning the upper and lower metal electrodes, and then welding tabs thereon to form positive and negative electrodes, so as to obtain the superconducting device.

9. The preparation method for the superconducting device according to claim 8, wherein the metal electrodes are prepared by metal deposition or standard electron beam exposure method.

10. The preparation method of the superconducting device according to claim 8, wherein each of the supporting and pressing blocks is configured as a silicon wafer with a $SiO_2$ passivation film on its surface.

11. The graphene/doped 2D layered material van der Waals heterojunction superconducting composite structure according to claim 2, wherein n is 1 or 2.

12. The graphene/doped 2D layered material van der Waals heterojunction superconducting composite structure according to claim 4, wherein the 2D layered material comprises one of hexagonal boron nitride, transition metal dichalcogenide, silylene, phosphorene or boron alkene.

13. The graphene/doped 2D layered material van der Waals heterojunction superconducting composite structure according to claim 4, wherein the 2D layered material comprises one of hexagonal boron nitride, molybdenum disulfide or phosphorene.

14. The graphene/doped 2D layered material van der Waals heterojunction superconducting composite structure according to claim 4, wherein the 2D layered material in the doped 2D layered material comprises a single layer of the 2D layered material or 2 to 10 layers of the 2D layered material.

15. The graphene/doped 2D layered material van der Waals heterojunction superconducting composite structure according to claim 5, wherein the doping is carried out by high-temperature diffusion or ion implantation.

16. The superconducting device according to claim 7, wherein materials of the metal electrodes are independently one of chromium, gold, silver, copper, nickel, palladium, platinum, or iridium metal or alloy.

* * * * *